(12) United States Patent
Kawauchi et al.

(10) Patent No.: US 9,474,189 B2
(45) Date of Patent: Oct. 18, 2016

(54) INVERTER DEVICE

(75) Inventors: Yuki Kawauchi, Chiyoda-ku (JP); Kensaku Matsuda, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 72 days.

(21) Appl. No.: 14/397,913

(22) PCT Filed: May 23, 2012

(86) PCT No.: PCT/JP2012/063232
§ 371 (c)(1),
(2), (4) Date: Oct. 30, 2014

(87) PCT Pub. No.: WO2013/175597
PCT Pub. Date: Nov. 28, 2013

(65) Prior Publication Data
US 2015/0131233 A1 May 14, 2015

(51) Int. Cl.
H05K 7/20 (2006.01)
H02M 7/00 (2006.01)
H05K 5/06 (2006.01)

(52) U.S. Cl.
CPC ......... *H05K 7/20418* (2013.01); *H02M 7/003* (2013.01); *H05K 5/06* (2013.01); *H05K 7/209* (2013.01); *H05K 7/20436* (2013.01)

(58) Field of Classification Search
None
See application file for complete search history.

(56) References Cited

U.S. PATENT DOCUMENTS 5,373,418 A * 12/1994 Hayasi ............... H01L 23/4006
257/718
5,940,272 A * 8/1999 Emori ................ H02M 7/003
165/185
8,670,237 B2 * 3/2014 Hatai ................. H05K 7/20409
165/80.3
2005/0280997 A1 * 12/2005 Maeda ................ H01L 23/367
361/703

(Continued)

FOREIGN PATENT DOCUMENTS

| CN | 101193546 A | 6/2008 |
|---|---|---|
| JP | 63-161886 A | 7/1988 |
| JP | 3-94096 U | 9/1991 |

(Continued)

OTHER PUBLICATIONS

Taiwanese Examination Report of Corresponding Taiwanese Application No. 101141745 dated Jul. 1, 2014.

(Continued)

Primary Examiner — Courtney Smith
(74) Attorney, Agent, or Firm — Sughrue Mion, PLLC (57) ABSTRACT

An inverter device includes a heat dissipation casing having a principal surface, heat dissipation fins arranged on an opposite side to the principal surface, a first concave portion provided adjacent to a region corresponding to the heat dissipation fins on the principal surface, and a second concave portion provided adjacent to the region corresponding to the heat dissipation fins on the principal surface, a semiconductor module arranged in the region corresponding to the heat dissipation fins on the principal surface and including a diode module and an inverter module, an inrush-current suppression resistor sealed by a sealing material in the first concave portion and electrically connected between the diode module and the inverter module, and a regenerative resistor sealed by the sealing material in the second concave portion and electrically connected between the diode module and the inverter module.

4 Claims, 6 Drawing Sheets

(56) References Cited

U.S. PATENT DOCUMENTS

2008/0130232 A1* 6/2008 Yamamoto ......... H05K 7/20909
 361/703
2008/0277780 A1* 11/2008 Hayakawa ......... H05K 7/20509
 257/717

FOREIGN PATENT DOCUMENTS

| JP | 06-127854 A | 5/1994 |
| JP | 10-051912 A | 2/1998 |
| JP | 10-136675 A | 5/1998 |
| JP | 2000-184584 A | 6/2000 |
| JP | 2003-259656 A | 9/2003 |
| JP | 2005-176488 A | 6/2005 |
| JP | 2006-005081 A | 1/2006 |
| JP | 2008-054384 A | 3/2008 |
| JP | 2008-140803 A | 6/2008 |
| JP | 2008-282931 A | 11/2008 |
| JP | 2009-044920 A | 2/2009 |
| JP | 2009-106046 A | 5/2009 |
| JP | 2010-187504 A | 8/2010 |

OTHER PUBLICATIONS

Notice of Rejection for corresponding Japanese Application 2013-513884 dated May 14, 2013.
International Search Report for PCT/JP2012/063232 dated Aug. 14, 2012.
Written Opinion for PCT/JP2012/063232 dated Aug. 14, 2012.
Communication dated May 27, 2016, issued by the Chinese Patent Office in counterpart Application No. 201280073386.8.

* cited by examiner

INVERTER DEVICE

CROSS REFERENCE TO RELATED APPLICATIONS

This application is a National Stage of International Application No. PCT/JP2012/063232 filed May 23, 2012, the contents of all of which are incorporated herein by reference in their entirety.

FIELD

The present invention relates to an inverter device.

BACKGROUND

It is described in Patent Literature 1 that in an electrical apparatus, a plurality of fins are provided on an internal cavity side of a casing, on which an electrical component generating a large amount of heat is mounted, an electrical component as a generation source of electromagnetic noise is arranged inside the casing, and the electrical component on the casing and the electrical component inside the casing are electrically connected by electric wires. According to Patent Literature 1, an electrical apparatus having excellent heat dissipation from the electrical component generating a large amount of heat, and having a small amount of emission of electromagnetic noise from the electrical component as the generation source of electromagnetic noise to outside can be realized.

CITATION LIST

Patent Literature

Patent Literature 1: Japanese Patent Application Laid-open No. H10-51912

SUMMARY

Technical Problem

According to the technique described in Patent Literature 1, the plurality of fins need to be provided inside of the casing in order to dissipate heat from the electrical component on the casing, and the electrical component as the generation source of electromagnetic noise need to be accommodated in a box-shaped casing so as not to hit against the fins, in order to reduce emission of electromagnetic noise from the electrical component as the generation source of electromagnetic noise to the outside. Therefore, the entire electrical apparatus tends to be large as a whole, and it is difficult to reduce a component mounting space.

The present invention has been achieved in view of the above problems, and an object of the present invention is to provide an inverter device that can reduce a component mounting space.

Solution to Problem

In order to solve the aforementioned problems, an inverter device according to one aspect of the present invention is constructed to include: a heat dissipation casing including a principal surface, heat dissipation fins arranged on an opposite side of the principal surface, a first concave portion provided adjacent to a region corresponding to the heat dissipation fins on the principal surface, and a second concave portion provided adjacent to the region corresponding to the heat dissipation fins on the principal surface; a semiconductor module arranged in the region corresponding to the heat dissipation fins on the principal surface and including a diode module and an inverter module; an inrush-current suppression resistor sealed by a sealing material in the first concave portion and electrically connected between the diode module and the inverter module; and a regenerative resistor sealed by the sealing material in the second concave portion and electrically connected between the diode module and the inverter module.

Advantageous Effects of Invention

According to the present invention, because an increase of the height of a heat dissipation casing exceeding the height of heat dissipation fins can be suppressed, the component mounting space can be reduced.

DESCRIPTION OF EMBODIMENTS

Exemplary embodiments of an inverter device according to the present invention will be explained below in detail with reference to the accompanying drawings. The present invention is not limited to the embodiments.

First Embodiment.

Figure 1:
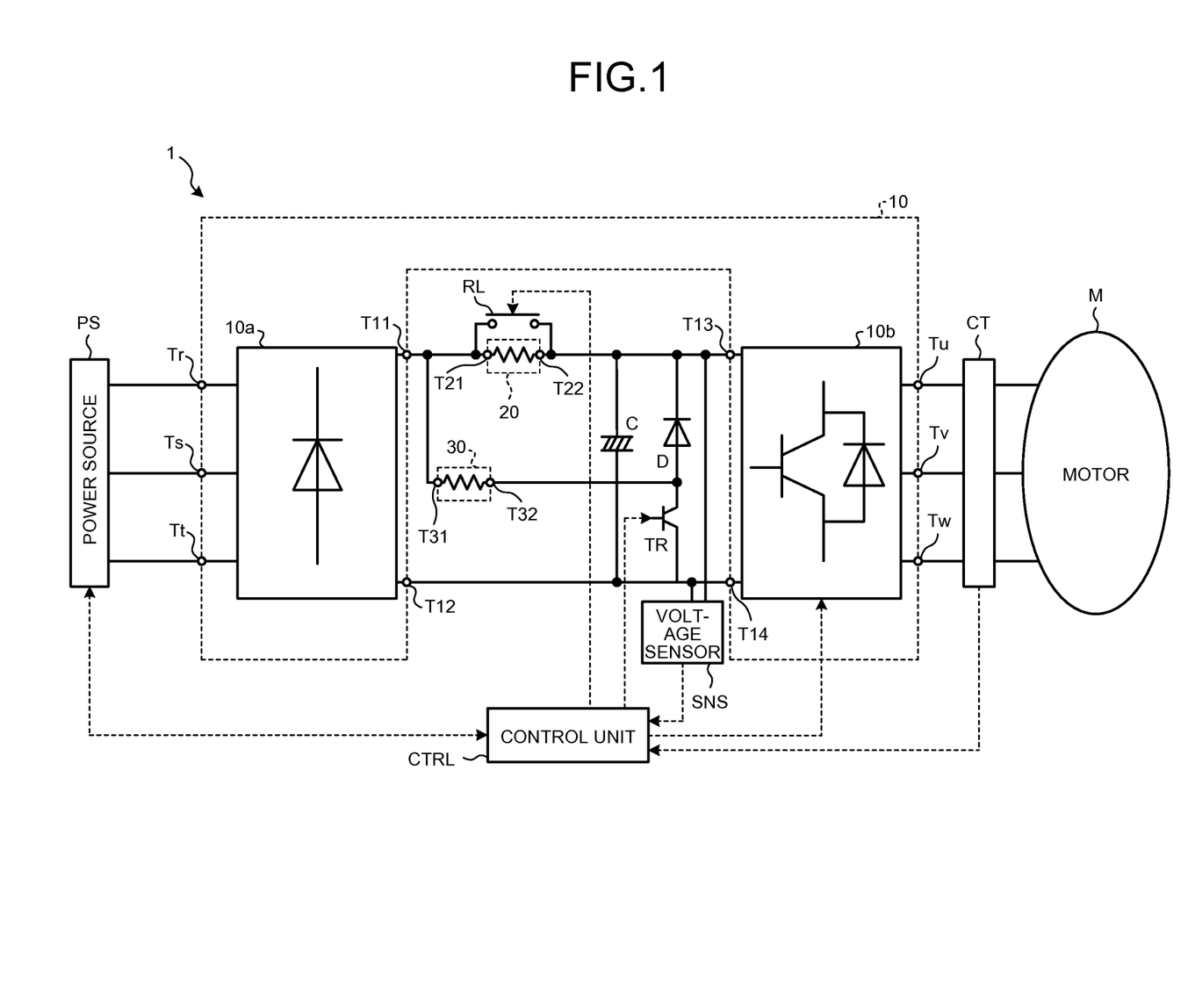
FIG. 1 shows a configuration of an inverter device according to a first embodiment.

A circuit configuration of an inverter device 1 according to a first embodiment is explained with reference to FIG. 1. FIG. 1 shows a circuit configuration of the inverter device 1.

The inverter device 1 includes a semiconductor module 10, a smoothing capacitor C, a current detector CT, a control unit CTRL, an inrush-current suppressing resistor 20, a relay RL, a regenerative resistor 30, a regenerative diode D, a regenerative transistor TR, and a voltage sensor SNS. The semiconductor module 10 includes a diode module 10a and an inverter module 10b.

The inverter device 1 converts AC power supplied from a power source PS to DC power by the diode module 10a, smoothes the DC power by the smoothing capacitor C, converts smoothed DC power to AC power by a switching operation of a plurality of switching elements in the inverter module 10b, and supplies the thus converted AC power to a motor M to drive the motor M.

At this time, a capacitor having a large capacity may be used for the smoothing capacitor C in order to perform smoothing by the smoothing capacitor C efficiently. Therefore, a large inrush current may flow into the inverter module 10b at the time of turning on the power source PS, and if a large inrush current flows in, the switching elements in the inverter module 10b may be deteriorated.

To suppress the inrush current, the inrush-current suppressing resistor 20 and the relay RL are connected in parallel on a P (positive) line between the diode module 10a and the inverter module 10b, and the control unit CTRL opens the relay RL at the time of turning on the power source PS so that an output current of the diode module 10a is consumed by the inrush-current suppressing resistor 20. That is, the inrush-current suppressing resistor 20 is electrically connected between the diode module 10a and the inverter module 10b. For example, one terminal T21 of the inrush-current suppressing resistor 20 is connected to a P (positive) side output terminal T11 of the diode module 10a, and the other terminal T22 of the inrush-current suppressing resistor 20 is connected to a P-side input terminal T13 of the inverter module 10b.

Because the motor M operates as a power generator when a high-speed operation is changed to a low-speed operation, a bus voltage may be increased by the regenerative power from the motor M, and when the bus voltage is increased, it becomes difficult for the inverter device 1 to perform an appropriate power conversion operation.

To suppress an increase in the bus voltage, the regenerative diode D and the regenerative transistor TR are connected between the P-line and an N (negative) line between the diode module 10a and the inverter module 10b and the regenerative resistor 30 is connected between an intermediate node of the regenerative diode D and the regenerative transistor TR and the P-line. Furthermore, the control unit CTRL turns on the regenerative transistor TR when an input side voltage of the inverter module 10b detected by the voltage sensor SNS exceeds a predetermined voltage, so that the regenerative power from the motor M is consumed by the regenerative resistor 30. That is, the regenerative resistor 30 is electrically connected between the diode module 10a and the inverter module 10b. For example, one terminal T31 of the regenerative resistor 30 is connected to the P-side output terminal T11 of the diode module 10a, and the other terminal T32 of the regenerative resistor 30 is connected to the P-side input terminal T13 of the inverter module 10b via the regenerative diode D, and is connected to an N (negative) side input terminal T14 of the inverter module 10b via the regenerative transistor TR.

In this manner, the inrush-current suppressing resistor 20 and the regenerative resistor 30 are electrically connected between the diode module 10a and the inverter module 10b in the semiconductor module 10. Therefore, it is desired to arrange the inrush-current suppressing resistor 20 and the regenerative resistor 30 near the semiconductor module 10 at the time of mounting.

Figure 2:
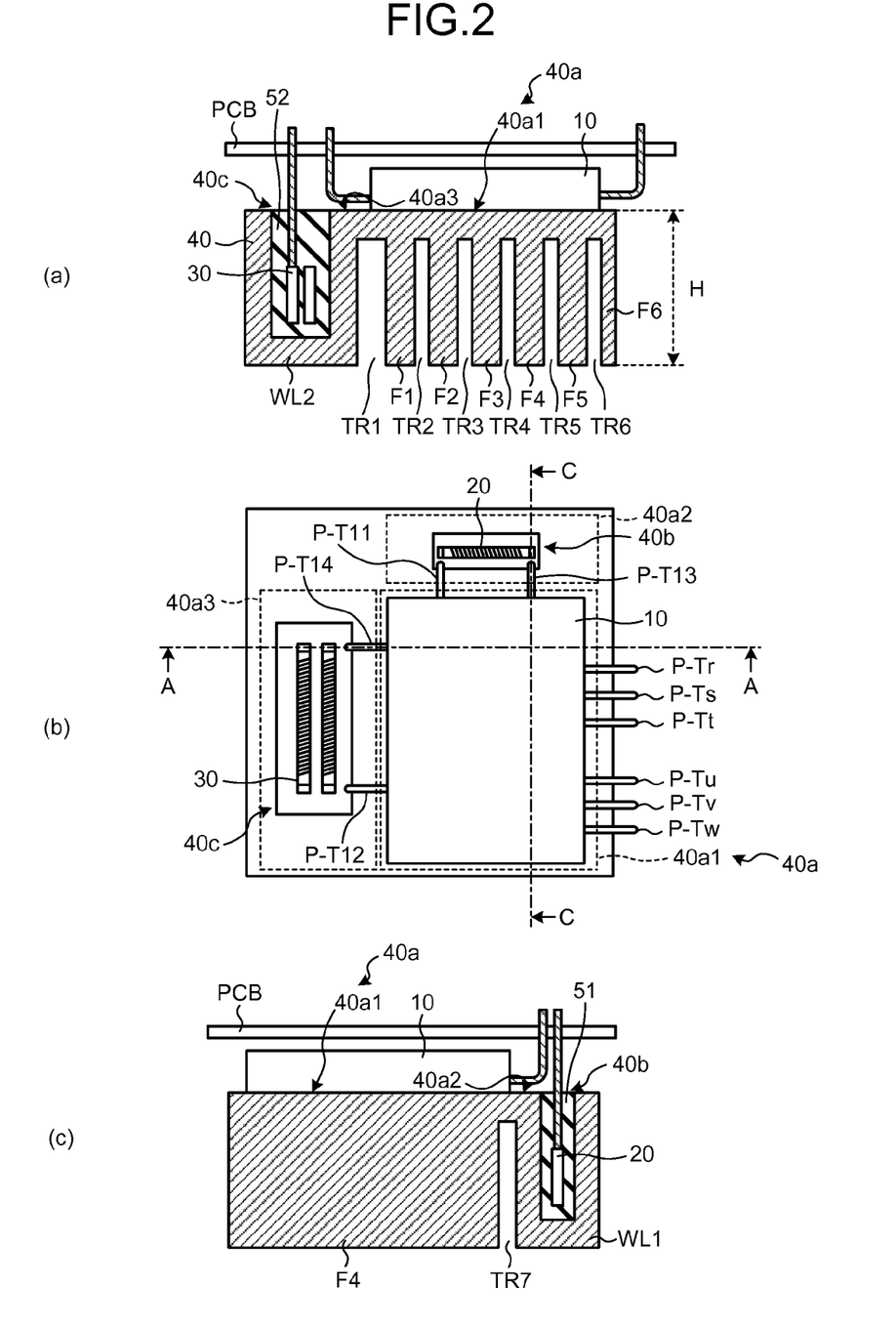
FIGS. 2a, 2b and 2c show a configuration of the inverter device according to the first embodiment.

A mounting configuration of the inverter device 1 is explained next with reference to FIG. 2. FIG. 2 shows a mounted state of the inverter device 1. FIG. 2(b) is a plan view showing the mounting configuration of the inverter device 1. FIG. 2(a) is a sectional view of FIG. 2(b) taken along a line A-A. FIG. 2(c) is a sectional view of FIG. 2(b) taken along a line C-C.

The inverter device 1 includes a heat dissipation casing 40, the semiconductor module 10, the inrush-current suppressing resistor 20, and the regenerative resistor 30.

The heat dissipation casing 40 accommodates the inrush-current suppressing resistor 20 and the regenerative resistor 30. The semiconductor module 10 is mounted on a principal surface 40a of the heat dissipation casing 40, and a plurality of heat dissipation fins F1 to F6 are integrally molded with a body of the heat dissipation casing 40. The inrush-current suppressing resistor 20 and the regenerative resistor 30 are sealed in the heat dissipation casing 40 by sealing materials 51 and 52.

Specifically, as shown in FIGS. 2(a) to 2(c), in the heat dissipation casing 40, grooves TR1 to TR6 having a substantially cuboid shape as a basic configuration and extending in a direction along the line C-C, and a groove TR7 extending in a direction along the line A-A are formed. The heat dissipation casing 40 is integrally molded, for example, by aluminum die-casting in the shape as shown in FIGS. 2(a) to 2(c).

More specifically, the grooves TR1 to TR6 and the groove TR7 are formed on the opposite side of the principal surface 40a of the heat dissipation casing 40, and the heat dissipation fins F1 to F6 are arranged on the opposite side of the principal surface 40a. A first concave portion 40b is provided in a region 40a2 adjacent to a region 40a1 corresponding to the heat dissipation fins F1 to F6, in the principal surface 40a of the heat dissipation casing 40. In the heat dissipation casing 40, a wall portion WL1 surrounding the first concave portion 40b is away from the heat dissipation fins F1 to F6 via the groove TR7. The first concave portion 40b has a shape corresponding to the region 40a2, and is formed in, for example, a substantially cuboid shape. In the principal surface 40a of the heat dissipation casing 40, a second concave portion 40c is provided in a region 40a3 adjacent to the region 40a1 corresponding to the heat dissipation fins F1 to F6. In the heat dissipation casing 40, a wall portion WL2 surrounding the second concave portion 40c is away from the heat dissipation fins F1 to F6 via the groove TR1. The second concave portion 40c has a shape corresponding to the region 40a3, and is formed in, for example, a substantially cuboid shape.

The semiconductor module 10 is arranged in the region 40a1 corresponding to the heat dissipation fins F1 to F6 on the principal surface 40a of the heat dissipation casing 40. Accordingly, heat generated by the switching operation of the switching elements in the semiconductor module 10 can be efficiently dissipated from the region 40a1 on the principal surface 40a via the heat dissipation fins F1 to F6.

The inrush-current suppressing resistor 20 is accommodated in the first concave portion 40b, and is sealed by the sealing material 51 in the first concave portion 40b. The sealing material 51 is, for example, cement having thermal conductivity, and transfers heat generated in the inrush-current suppressing resistor 20 to the wall portion WL1 of the heat dissipation casing 40. Accordingly, heat generated in the inrush-current suppressing resistor 20 can be efficiently dissipated from the sealing material 51 via the wall portion WL1. Because the wall portion WL1 is away from the heat dissipation fins F1 to F6, heat generated in the inrush-current suppressing resistor 20 can be dissipated without interfering with a heat dissipation route of heat generated in the semiconductor module 10.

The regenerative resistor 30 is accommodated in the second concave portion 40c, and is sealed by the sealing material 52 in the second concave portion 40c. The sealing material 52 is, for example, cement having thermal conductivity, and transfers heat generated in the regenerative resistor 30 to the wall portion WL2 of the heat dissipation casing 40. Accordingly, heat generated in the regenerative resistor 30 can be efficiently dissipated from the sealing material 52 via the wall portion WL2. Because the wall portion WL2 is away from the heat dissipation fins F1 to F6, heat generated in the regenerative resistor 30 can be dissipated without interfering with a heat dissipation route of heat generated in the semiconductor module 10.

The semiconductor module 10 includes terminal pins P-Tr, P-Ts, and P-Tt as input terminals Tr, Ts, Tt (FIG. 1) of the diode module 10a. The terminal pins P-Tr, P-Ts, and P-Tt are connected to the power source PS (see FIG. 1) via a printed circuit board PCB. The semiconductor module 10 includes terminal pins P-T11 and P-T12 as output terminals T11 and T12 (see FIG. 1) of the diode module 10a. The terminal pin P-T11 is connected to the one terminal T21 of the inrush-current suppressing resistor 20 and the one terminal T31 of the regenerative resistor 30 (see FIG. 1) via the printed circuit board PCB. The terminal pin P-T12 is connected to the N-side input terminal T14 (see FIG. 1) of the inverter module 10b via the printed circuit board PCB.

The semiconductor module 10 includes terminal pins P-T13 and P-T14 as input terminals T13 and T14 (see FIG. 1) of the inverter module 10b. The terminal pin P-T13 is connected to the other terminal T22 of the inrush-current suppressing resistor 20 (see FIG. 1) via the printed circuit board PCB, and is also connected to the other terminal T32 of the regenerative resistor 30 (see FIG. 1) via the printed circuit board PCB and the regenerative diode D (see FIG. 1). The semiconductor module 10 includes terminal pins P-Tu, P-Tv, and P-Tw as output terminals Tu, Tv, Tw of the inverter module 10b. The terminal pins P-Tu, P-Tv, and P-Tw are connected to the motor M (see FIG. 1) via the printed circuit board PCB.

Arrangement of the terminal pins shown in FIG. 2 is only an example, and is not limited to the case shown in FIG. 2. The smoothing capacitor C, the relay RL, the regenerative diode D, the regenerative transistor TR, and the voltage sensor SNS shown in FIG. 1 can be mounted on, for example, the printed circuit board PCB, or at a position adjacent to the printed circuit board PCB, although not shown in FIG. 2.

Here, let us consider a case in which the heat dissipation casing with the semiconductor module 10 arranged on the principal surface thereof is formed in a box shape, and the inrush-current suppressing resistor 20 and the regenerative resistor 30 are mounted therein. In this case, heat dissipation fins need to be provided in the heat dissipation casing in order to dissipate heat from the semiconductor module 10 on the principal surface of the heat dissipation casing, and it is required to accommodate the inrush-current suppressing resistor 20 and the regenerative resistor 30 therein so as not to hit against the heat dissipation fins. Therefore, the entire inverter device tends to become large, and it is difficult to reduce the component mounting space.

On the other hand, in the first embodiment, the inrush-current suppressing resistor 20 is sealed in the first concave portion 40b provided adjacent to the region corresponding to the heat dissipation fins F1 to F6 on the principal surface 40a by the sealing material 51, and the regenerative resistor 30 is sealed in the second concave portion 40c provided adjacent to the region corresponding to the heat dissipation fins F1 to F6 on the principal surface 40a by the sealing material 52. Accordingly, occurrence of the fact that the height H of the heat dissipation casing 40 (see FIG. 2(a)) becomes high and exceeds the height of the tip end of the heat dissipation fins Fl to F6 can be suppressed, thereby enabling to reduce the component mounting space.

Alternatively, a case in which the inrush-current suppressing resistor 20 and the regenerative resistor 30 are mounted on the printed circuit board PCB is considered here. In this case, these resistors need to be accommodated in a ceramic or metal case and sealed by cement for fixation of the position thereof or protection at the time of disconnection of a resistance wire. Accordingly, the manufacturing cost of the inrush-current suppressing resistor 20 and the regenerative resistor 30 tends to be increased, and the manufacturing cost of the inverter device may be increased.

On the other hand, according to the first embodiment, the inrush-current suppressing resistor 20 and the regenerative resistor 30 are embedded in the first concave portion 40b and the second concave portion 40c, and a ceramic or aluminum casing that covers the resistors provided therein to protect the resistors is not required, thereby enabling to obtain functions of the regenerative resistor and the inrush-current suppressing resistor at a low cost. Accordingly, the manufacturing cost of the inrush-current suppressing resistor 20 and the regenerative resistor 30 can be reduced, thereby enabling to reduce the manufacturing cost of the inverter device. Because the inrush-current suppressing resistor 20 and the regenerative resistor 30 are embedded in the first concave portion 40b and the second concave portion 40c, fixing of the resistors by fastening screws is not required, and assembly man-hour can be reduced.

According to the first embodiment, the inrush-current suppressing resistor 20 electrically connected between the diode module 10a and the inverter module 10b is sealed in the first concave portion 40b at a position adjacent to the semiconductor module 10, and the regenerative resistor 30 electrically connected between the diode module 10a and the inverter module 10b is sealed in the second concave portion 40c at a position adjacent to the semiconductor module 10. Accordingly, respective wire lengths between each of the inrush-current suppressing resistor 20 and the regenerative resistor 30 and each of the diode module 10a and the inverter module 10b can be easily shortened.

According to the first embodiment, the heat dissipation casing 40 is integrally molded by, for example, the aluminum die-casting. Because the heat dissipation fins F1 to F6 are integrally formed with the heat dissipation casing 40, the heat dissipation fins F1 to F6 do not need to be connected to the heat dissipation casing 40, thereby enabling to reduce the assembly man-hours.

Alternatively, let us consider a case in which the heat dissipation casing arranged with the semiconductor module 10 on the principal surface thereof is formed in a box shape, a plurality of heat dissipation fins are provided therein, and the inrush-current suppressing resistor 20 and the regenerative resistor 30 are fixed and mounted between the heat dissipation fins by a thermally conductive fixing material. In this case, when heat generated in the semiconductor module 10 is dissipated from the principal surface of the heat dissipation casing via the heat dissipation fins, heat generated by the inrush-current suppressing resistor 20 and the regenerative resistor 30 easily interfere therewith. For example, a flow of heat in a direction opposite to a direction from the principal surface of the heat dissipation casing toward the heat dissipation fins may be generated, and efficient heat dissipation becomes difficult for each of the semiconductor module 10, the inrush-current suppressing resistor 20, and the regenerative resistor 30.

On the other hand, according to the first embodiment, the wall portion WL1 surrounding the first concave portion 40b is away from the heat dissipation fins Fl to F6 via the groove TR7. Accordingly, heat generated in the inrush-current suppressing resistor 20 can be dissipated without interfering with the heat dissipation path of heat generated in the semiconductor module 10. Furthermore, the wall portion WL2 surrounding the second concave portion 40c is away from the heat dissipation fins Fl to F6 via the groove TR1. Accordingly, heat generated in the regenerative resistor 30 can be dissipated without interference with the heat dissipation path of heat generated in the semiconductor module 10. Accordingly, efficient heat dissipation is facilitated for each of the semiconductor module 10, the inrush-current suppressing resistor 20, and the regenerative resistor 30.

Second Embodiment.

An inverter device 1i according to a second embodiment is explained next. In the following descriptions, elements different from those of the first embodiment are mainly explained.

In the first embodiment, temperatures of the inrush-current suppressing resistor 20 and the regenerative resistor 30 are not particularly taken into consideration. However, according to the second embodiment, temperatures of the inrush-current suppressing resistor 20 and the regenerative resistor 30 can be monitored.

Figure 3:
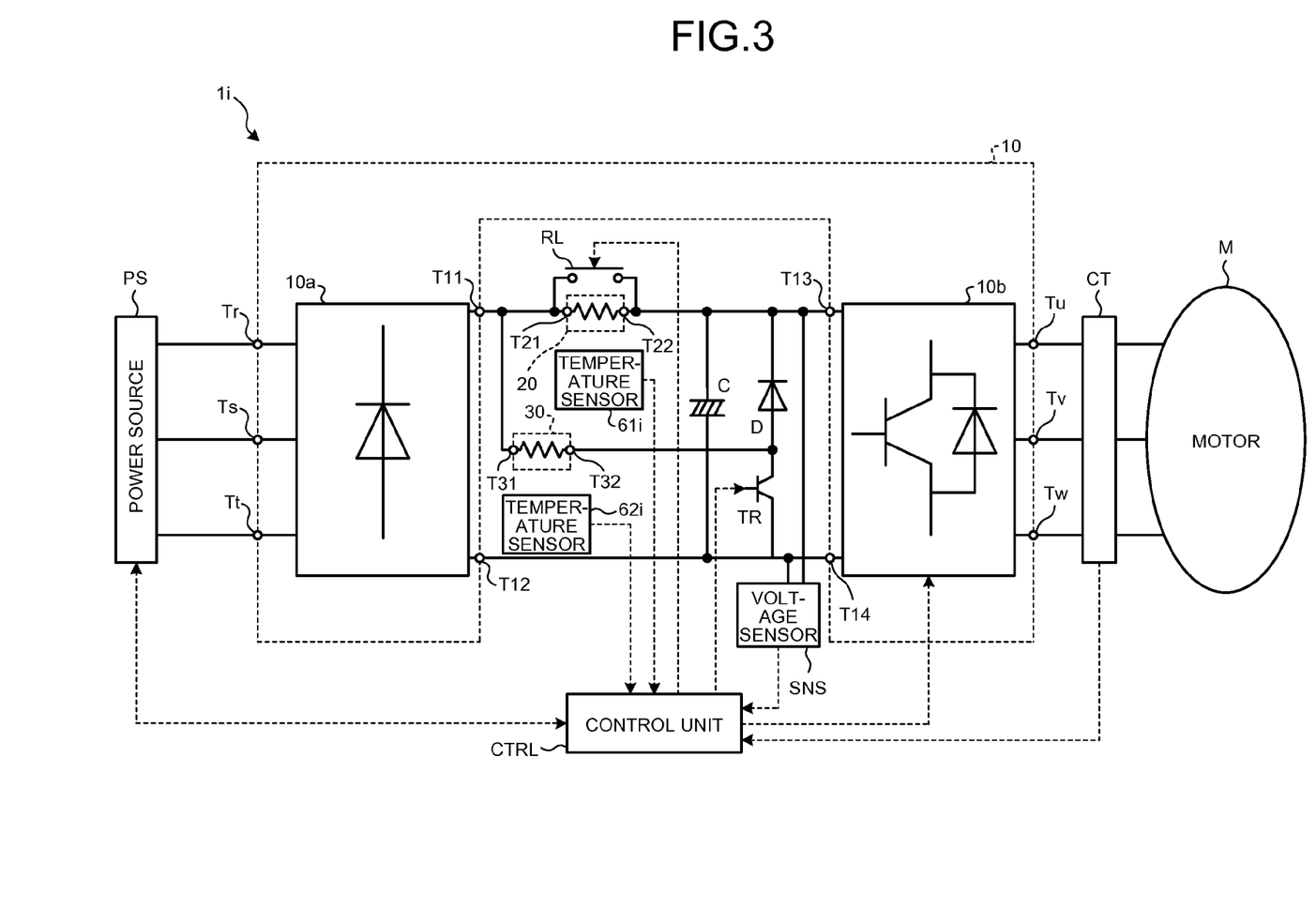
FIG. 3 shows a configuration of an inverter device according to a second embodiment.

Specifically, as shown in FIG. 3, the inverter device 1i further includes a temperature sensor (first temperature sensor) 61i and a temperature sensor (second temperature sensor) 62i. FIG. 3 shows a circuit configuration of the inverter device 1i. The temperature sensor 61i detects the temperature of the inrush-current suppressing resistor 20, and supplies a detection result to the control unit CTRL. The temperature sensor 62i detects the temperature of the regenerative resistor 30, and supplies a detection result to the control unit CTRL. The control unit CTRL compares, for example, the temperature of the inrush-current suppressing resistor 20 with a predetermined first threshold and the temperature of the regenerative resistor 30 with a predetermined second threshold, according to the detection result of the temperature sensor 61i and the detection result of the temperature sensor 62i, thereby determining whether abnormal heat generation has occurred in at least one of the inrush-current suppressing resistor 20 and the regenerative resistor 30. When abnormal heat generation has occurred in at least one of the inrush-current suppressing resistor 20 and the regenerative resistor 30, the control unit CTRL stops the inverter device 1i by turning off the power source PS or the like. Accordingly, burnout of at least one of the inrush-current suppressing resistor 20 and the regenerative resistor 30 or the like can be suppressed.

Figure 4:
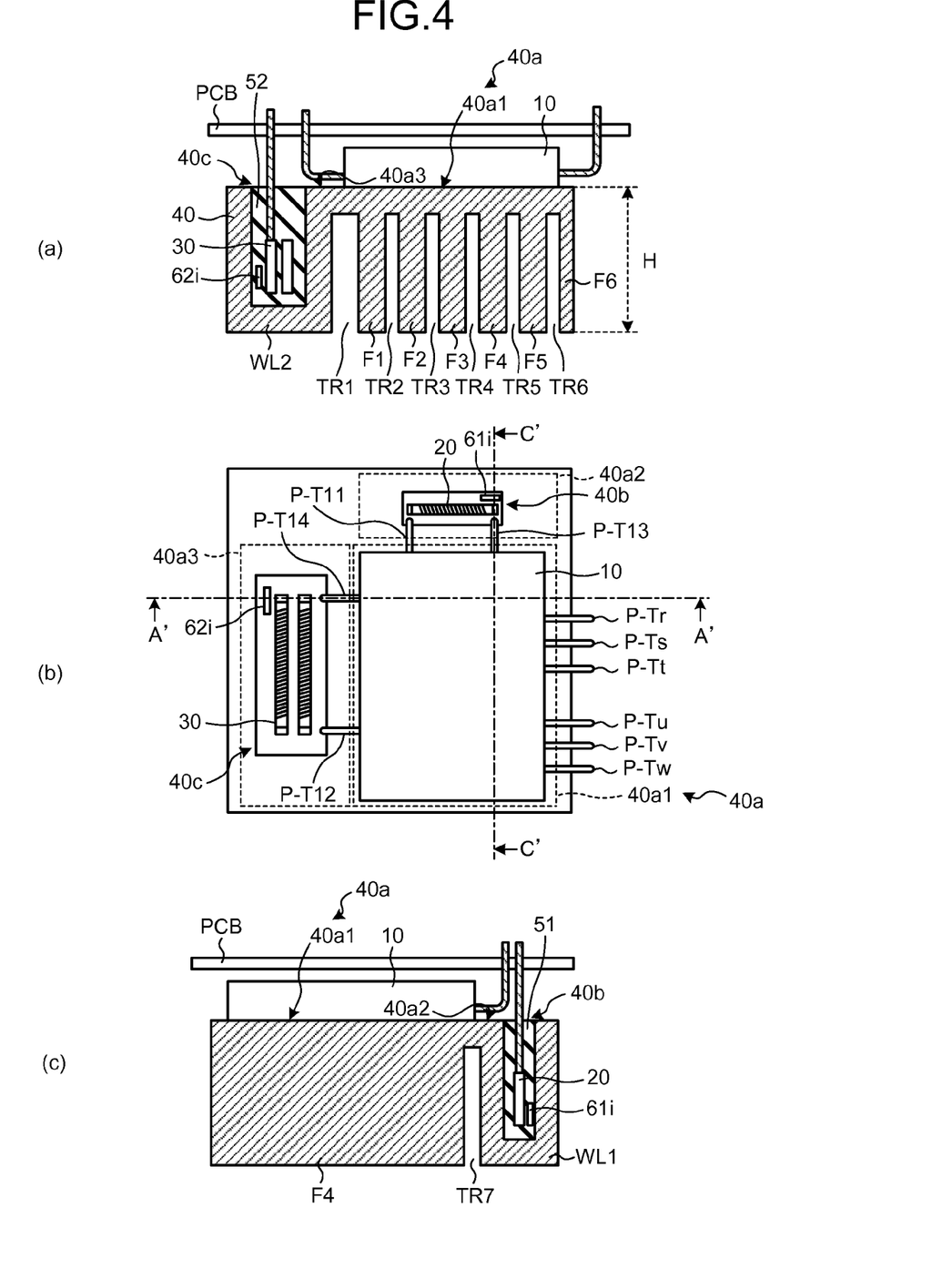
FIGS. 4a, 4b and 4c show a configuration of the inverter device according to the second embodiment.

A mounting configuration of the inverter device 1i is different from that of the first embodiment in the following point as shown in FIG. 4. FIG. 4 shows the mounting configuration of the inverter device 1i.

The temperature sensor 61i is accommodated in the first concave portion 40b together with the inrush-current suppressing resistor 20, and is sealed in the first concave portion 40b together with the inrush-current suppressing resistor 20 by the sealing material 51. Accordingly, the temperature sensor 61i can detect the temperature of the inrush-current suppressing resistor 20. A wire (not shown) of the temperature sensor 61i is connected to the control unit CTRL via the printed circuit board PCB (see FIG. 3). The temperature sensor 61i is, for example, a thermistor, a resistance temperature detector, or a thermocouple.

The temperature sensor 62i is accommodated in the second concave portion 40c together with the regenerative resistor 30, and is sealed in the second concave portion 40c together with the regenerative resistor 30 by the sealing material 52. Accordingly, the temperature sensor 62i can detect the temperature of the regenerative resistor 30. A wire (not shown) of the temperature sensor 62i is connected to the control unit CTRL via the printed circuit board PCB (see FIG. 3). The temperature sensor 62i is, for example, a thermistor, a resistance temperature detector, or a thermocouple.

In this manner, according to the second embodiment, the temperature sensor 61i is sealed in the first concave portion 40b together with the inrush-current suppressing resistor 20 by the sealing material 51, and the temperature sensor 62i is sealed in the second concave portion 40c together with the regenerative resistor 30 by the sealing material 52. Accordingly, the temperatures of the inrush-current suppressing resistor 20 and the regenerative resistor 30 can be monitored, while suppressing an increase of the component mounting space.

Third Embodiment.

An inverter device 1j according to a third embodiment is explained next. In the following descriptions, elements different from those of the first embodiment are mainly explained.

According to the first embodiment, the printed circuit board PCB is interposed between the semiconductor module 10 and each of the inrush-current suppressing resistor 20 and the regenerative resistor 30 for electrical connection. However, according to the third embodiment, the printed circuit board PCB is not interposed between the semiconductor module 10 and each of the inrush-current suppressing resistor 20 and the regenerative resistor 30 for electrical connection.

Figure 5:
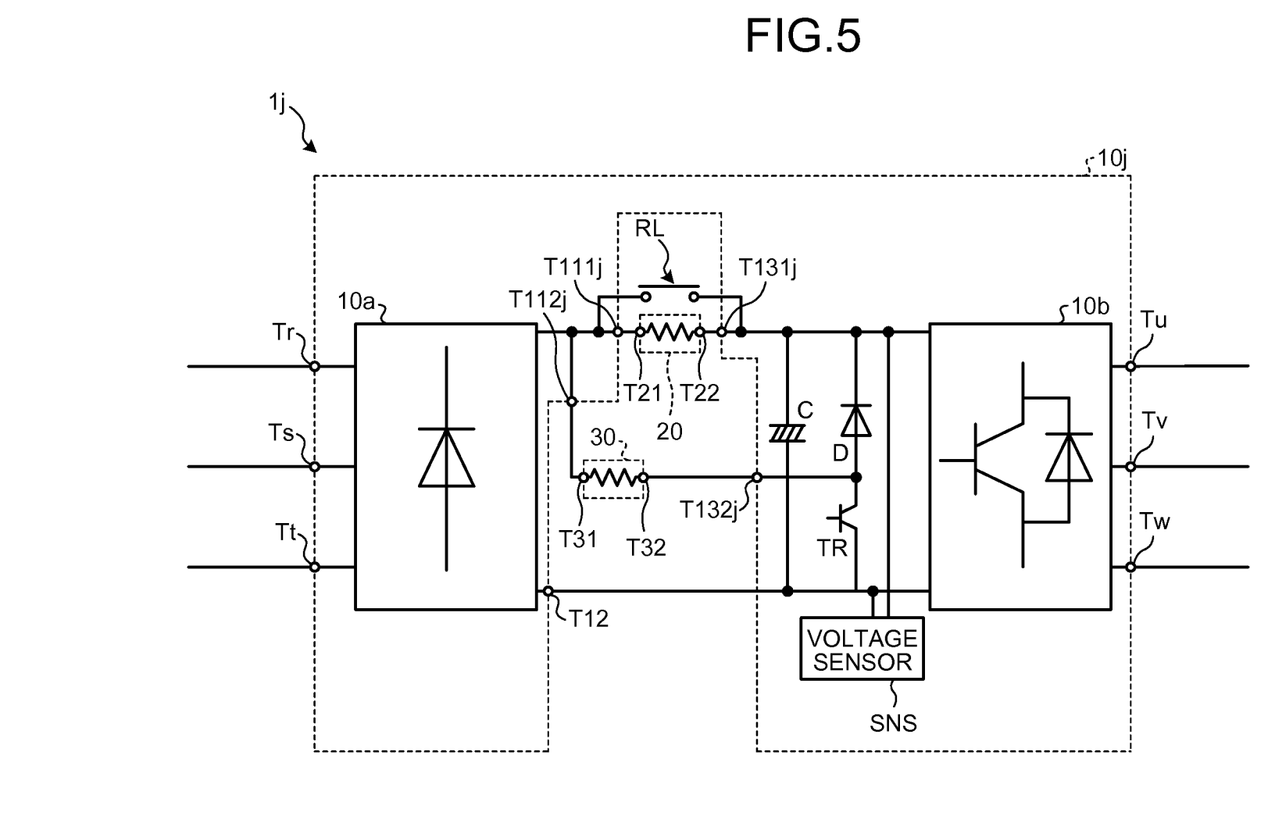
FIG. 5 shows a configuration of an inverter device according to a third embodiment.

Specifically, as shown in FIG. 5, in the inverter device 1j, a semiconductor module 10j further includes the regenerative diode D, the regenerative transistor TR, and the voltage sensor SNS in addition to the diode module 10a and the inverter module 10b. Accordingly, in the semiconductor module 10j, terminals T111j and T131j can be provided as terminals to be directly connected to the one terminal T21 and the other terminal T22 of the inrush-current suppressing resistor 20. Terminals T112j and T132j can be also provided as terminals to be directly connected to the one terminal T31 and the other terminal T32 of the regenerative resistor 30.

Figure 6:
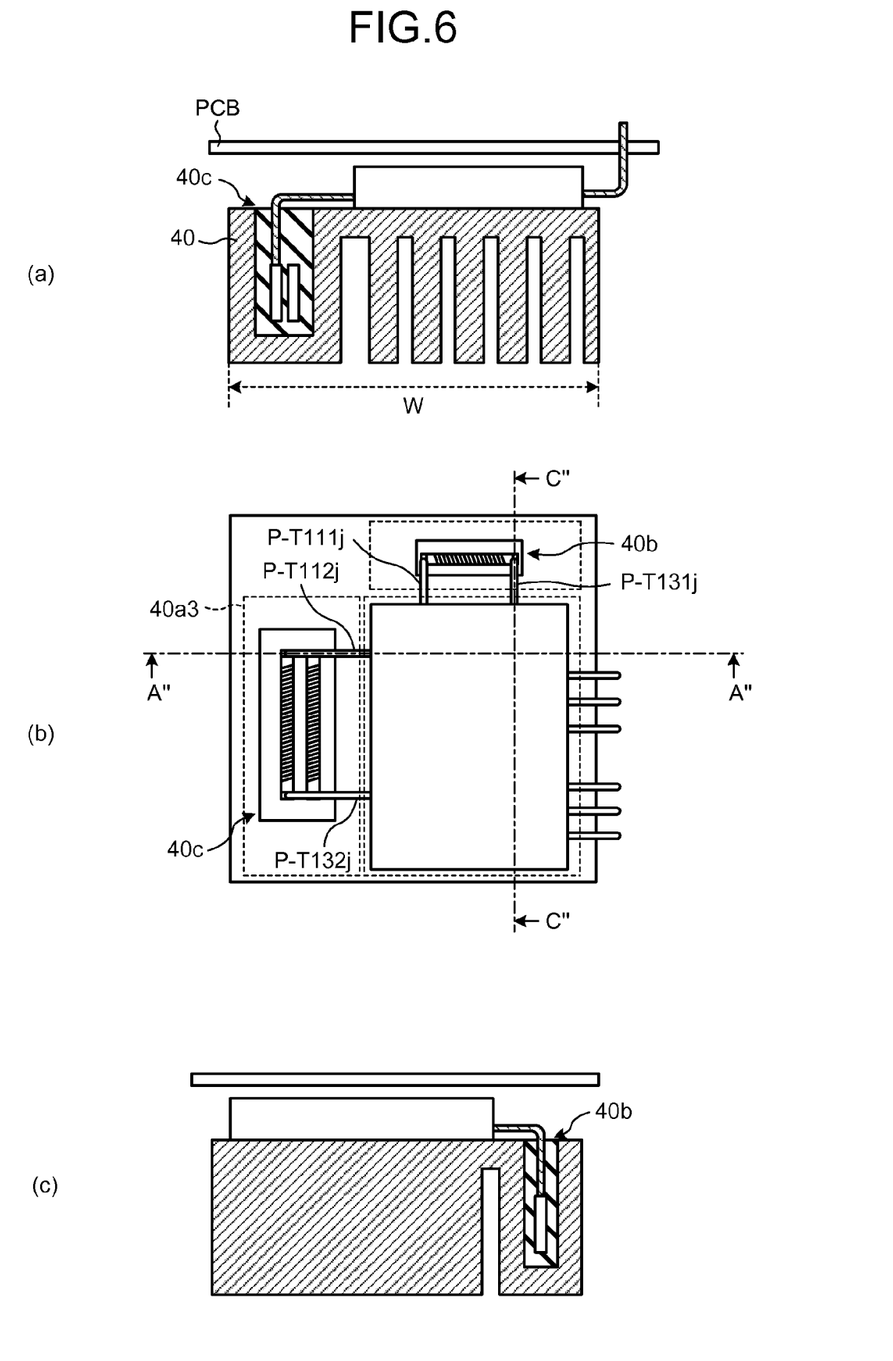
FIGS. 6a, 6b and 6c show a configuration of the inverter device according to the third embodiment.

A mounting configuration of the inverter device 1j is different from that of the first embodiment in the following point as shown in FIG. 6. FIG. 6 shows the mounting configuration of the inverter device 1j.

The semiconductor module 10j includes terminal pins P-T111j and P-T131j as terminals T111j and T131j (see FIG. 5). The terminal pins P-T111j and P-T131j extend from the semiconductor module 10j into the first concave portion 40b, and are connected to the both terminals T21 and T22 of the inrush-current suppressing resistor 20 (see FIG. 5).

The semiconductor module 10j also includes terminal pins P-T112j and P-T132j as terminals T112j and T132j (see FIG. 5). The terminal pins P-T112j and P-T132j extend from the semiconductor module 10j into the second concave portion 40c, and are connected to the both terminals T31 and T32 of the regenerative resistor 30 (see FIG. 5).

In this manner, according to the third embodiment, the terminal pins P-T111j and P-T131j extend from the semiconductor module 10j into the first concave portion 40b, and are connected to the both terminals of the inrush-current suppressing resistor 20. The terminal pins P-T112j and P-T132j extend from the semiconductor module 10j into the second concave portion 40c, and are connected to the both terminals of the regenerative resistor 30. Accordingly, a width W of the heat dissipation casing 40 in a plane direction can be easily reduced, thereby enabling to reduce the component mounting space further.

Furthermore, according to the third embodiment, wiring between each of the inrush-current suppressing resistor 20 and the regenerative resistor 30 and each of the diode module 10a and the inverter module 10b can be reduced respectively, thereby enabling to reduce the assembly man-hours further.

INDUSTRIAL APPLICABILITY

As described above, the inverter device according to the present invention is useful for mounting a semiconductor module.

REFERENCE SIGNS LIST 1, 1i, 1j inverter device
10, 10j semiconductor module
10a diode module
10b inverter module
20 inrush-current suppressing resistor
30 regenerative resistor
40 heat dissipation casing
40a principal surface
40b first concave portion
40c second concave portion
51, 52 sealing material
61i, 62i temperature sensor
F1 to F6 heat dissipation fin

The invention claimed is:

1. An inverter device comprising:
a heat dissipation casing including a principal surface, heat dissipation fins arranged on an opposite side of the principal surface, a first concave portion provided adjacent to a region corresponding to the heat dissipation fins on the principal surface, and a second concave portion provided adjacent to the region corresponding to the heat dissipation fins on the principal surface;
a semiconductor module arranged in the region corresponding to the heat dissipation fins on the principal surface and including a diode module and an inverter module;
an inrush-current suppression resistor sealed by a sealing material in the first concave portion and electrically connected between the diode module and the inverter module; and
a regenerative resistor sealed by the sealing material in the second concave portion and electrically connected between the diode module and the inverter module.

2. The inverter device according to claim 1, wherein the heat dissipation casing is integrally molded by aluminum die-casting.

3. The inverter device according to claim 1, further comprising:
a first temperature sensor sealed by the sealing material in the first concave portion to detect a temperature of the inrush-current suppression resistor; and
a second temperature sensor sealed by the sealing material in the second concave portion to detect a temperature of the regenerative resistor.

4. The inverter device according to claim 1, wherein the semiconductor module further includes
a first terminal pin connected to the diode module,
a second terminal pin connected to the inverter module,
a third terminal pin connected to the diode module, and
a fourth terminal pin connected to the inverter module,
the first terminal pin and the second terminal pin extend from the semiconductor module to inside of the first concave portion, and are connected to opposite ends of the inrush-current suppression resistor, and
the third terminal pin and the fourth terminal pin extend from the semiconductor module to inside of the second concave portion, and are connected to opposite ends of the regenerative resistor.

* * * * *